United States Patent [19]

Singer et al.

[11] Patent Number: 4,960,384

[45] Date of Patent: Oct. 2, 1990

[54] RETAINING MEANS FOR REMOVABLE COMPUTER DRIVE AND RELEASE MEANS FOR SAME

[75] Inventors: Richard Singer, Menlo Park; Daniel Farmer, Mountain View, both of Calif.

[73] Assignee: Silicon Graphics Inc., Mountain View, Calif.

[21] Appl. No.: 408,741

[22] Filed: Sep. 18, 1989

[51] Int. Cl.$^5$ ............................................ H01R 13/62
[52] U.S. Cl. .................................... 439/155; 439/159; 439/357
[58] Field of Search .................. 439/152–160, 439/351–355, 64, 325–328, 357; 361/399, 412, 413, 415

[56] References Cited

U.S. PATENT DOCUMENTS

| 4,580,192 | 4/1986 | Beun | 439/155 |
| 4,734,567 | 3/1988 | Hansbauer | 439/352 |
| 4,810,200 | 3/1989 | Sakamoto | 439/155 |

FOREIGN PATENT DOCUMENTS 1096720  6/1984  U.S.S.R. ............................ 439/155

Primary Examiner—David L. Pirlot
Attorney, Agent, or Firm—Blakely, Sokoloff, Taylor, Zafman

[57] ABSTRACT

The present invention is a device for the easy installation and removal of a drive system from a computer housing. The invention also comprises a novel release button designed to activate the release mode of the drive system, and is also generally useful as a button assembly.

3 Claims, 8 Drawing Sheets

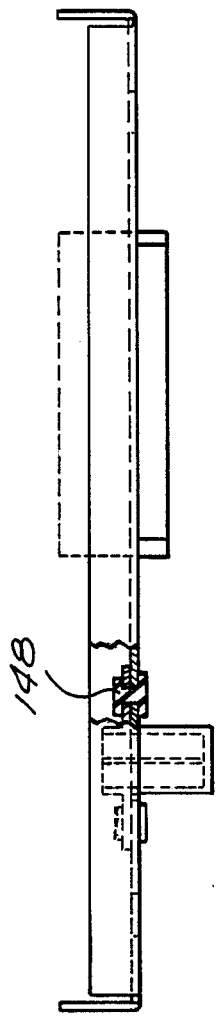
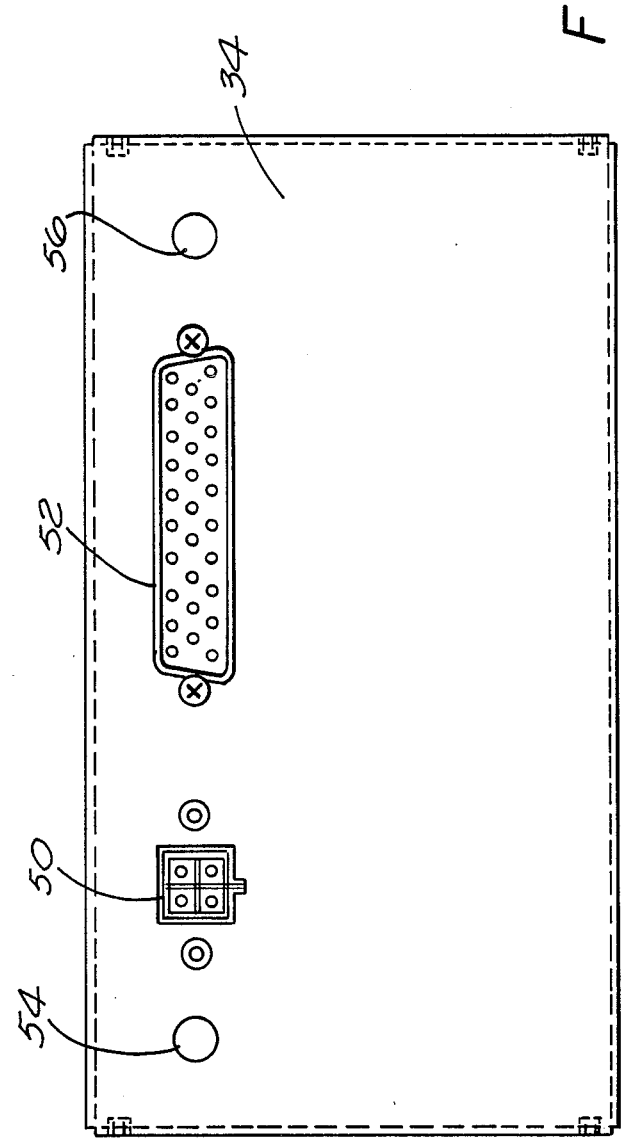

RETAINING MEANS FOR REMOVABLE COMPUTER DRIVE AND RELEASE MEANS FOR SAME

BACKGROUND OF THE INVENTION

1. Field of the Invention:

This invention relates to the fields of computer housing design and bracket design, and specifically, to a bracket for retaining a removable drive assembly in a computer housing, release means for releasing said drive assembly therefrom and a new button means adapted for use in actuating the release mode of said bracket assembly.

2. Art Background:

Certain hard disk drive systems have removable, interchangeable hard disk media, and a substantial number of patents are directed to the construction and operation of such drives. There is, however, a distinct lack of technology directed to removable drives such as disk drives, floppy disk drives and tape drives, where the entire drive, and not just the medium of the hard disk, floppy disk or tape itself, is easily removable from the computer housing and insertable therein.

There are several advantages which may be achieved by such a removable drive system. The most significant advantage is the ability of the drive to be quickly installed and removed from the computer housing to provide for easy access to the drive for repair or replacement. There is no need to disconnect any of the cabling prior to removal, making removal of the drive fast and error-free. Such a removable drive system also provides a means of economizing on expensive drive systems. In this regard, computers lacking expensive drive systems can be provided in several locations, and a single drive can be interchangeably installed in each of the computers depending on need. In a similar setup, one tape drive system may be employed for use in numerous computers as a means of backing up such computers without having to incur the expense of purchasing separate tape drives. Additionally, a removable drive can be removed and secured when not in use to ensure the security of the data on the drive.

Of course, the problems of installation of the drive and the alignment of the heads to the media in the case of floppy drives and some removable hard disk system, which occur in the case of removable media systems would not be present in a system in which the entire drive assembly is removable.

SUMMARY OF THE INVENTION

The present invention is an assembly of certain components which facilitate the easy installation and removal of a drive system from a computer housing. The invention also comprises a novel release button designed to activate the release mode of the drive system, and is also generally useful as a button assembly.

More specifically, the invention comprises a track installed in the mounting means in the computer housing. The track has upper and lower lips adapted to accommodate the bracket assembly which is attached to the drive to secure the bracket assembly within the drive mounting. The tracks are disposed on opposing side walls of the mounting means.

The bracket assembly comprises two side bracket members comprising an elongated, generally bar-shaped member attached to opposite sides of the drive. The side bracket assembly, which is preferably formed out of molded, springy plastic, has tensioning means for providing pressure against the top and sides of the track to act as a shock absorbing system for the drive and permit tolerance of the drive within the mounting. The tensioning means provide pressure in all three axes to accommodate shock in any and all directions and to provide a secure fit for the drive within the mounting. Also, in the rear portion of the bracket there is a spring member which is compressed when the drive is installed in the mounting, and which ejects the drive outward slightly when the drive is released from its installed position in the mounting. Small nibs are provided along the sides of the brackets to secure the drive within the mounting means at certain positions.

At least one side bracket is provided with a detent for retaining the locking means, described below, when the drive is locked in place. Preferably, a smooth surface is provided along the side bracket adjacent the detent against which the locking means slides until a flange on the locking means reaches and engages the detent to hold the locking means in place until it is released.

Each side bracket is connected to the rear bracket which is preferably coupled to said side brackets so that the rear bracket has some freedom of movement. Installed in the rear bracket are a pair of alignment pins pointed in the direction of travel of the drive during installation. Also installed in the rear bracket are several electrical connectors. The alignment pins and connectors are carefully positioned with respect to one another so that when the drive is installed, the pins comprising the electrical connector in the rear bracket are accurately plugged into the pin receptor at the rear of the drive mounting. The freedom of movement in the rear bracket allows the electrical connector pins to adjust position so that they will be plugged in.

The rear of the mounting means comprises a plate with components disposed therein to mate with the components in the rear bracket. Alignment pin receiving members are aligned with the pins when the drive is installed. The mating receptacle for the power connector is installed on bushings which permit some freedom of movement to allow the power plug and receptacle to mate.

The invention also comprises a locking means and a release means for releasing the locking means and thereby releasing the drive from the mounting. The locking means and release means are installed outside the drive mounting in substantial alignment with the track. The locking means is a generally elongated member with a flange member disposed perpendicularly thereto at the end therof and directed inward and inside the drive mounting. The locking means is pivotally attached to the mounting means. A ramp means is provided at the other end of the locking means which is designed to cooperate with the release means. The ramp means terminates at a locking flange which is directed inward toward the drive and cooperates with the detent in the side bracket to lock the drive in place. The ramp means is angled so that pressure applied by the release means forces the locking means to pivot so that the flange means is pulled out of the detent and also so that the catch means pivots forward against the end of the side bracket so that the drive is ejected. During installation of the drive, the end of the side bracket abuts the catch means forcing the locking flange to pivot toward the drive and into the detent in the side bracket.

The release means comprises an elongated button having one end disposed in an accessible position and the other end abutting the ramp means of the flange means. The elongated button is slidably attached to the drive mounting so that it can be slid from a lock position to a release position.

In the preferred embodiment, the release means comprises a button member slidably disposed in a bracket member. The bracket member has several tab means which hold the button member in the bracket member. The button member is slidably secured in the bracket member and is formed of flexible plastic. The button member has stop means to restrict the movement of the button member to limit its range of motion within desired limits. Flexible arms on the button member spread outward and abut an angled or slanted wall on the bracket member, so that when the button member is depressed or activated, the button member travels to from a first position in which the arms are spread, to a second position in which the arms are flexed closed. Under these conditions, the stress on the arms tends to force the arms open, which when forced against the angled walls, tends to push the button back to its first position.

The present invention will best be understood by reference to the drawings, a brief description of which follows, and by reference to the detailed description of the invention set forth herein.

BRIEF DESCRIPTION OF THE DRAWINGS

FIG. 1a is a top view of the preferred embodiment of the release means comprising the release means bracket and button of FIG. 1.

FIG. 14 is a top view of the rear plate of the drive mounting of the present invention.

FIG. 15 is a front view of the rear bracket of FIG. 14 of the present invention.

DETAILED DESCRIPTION OF THE INVENTION

The present invention is directed to an assembly for easily removing and installing a drive system in a computer housing. The present invention may be incorporated for use with any type of drive system, including a removable hard disk drive system, floppy drive system and tape drive system. For the purposes of convenience and clarity, the present invention will be described for use in conjunction with a hard disk drive system, it being understood by persons of ordinary skill in the art that the other drive systems may also be used with the invented assembly.

Figure 17:
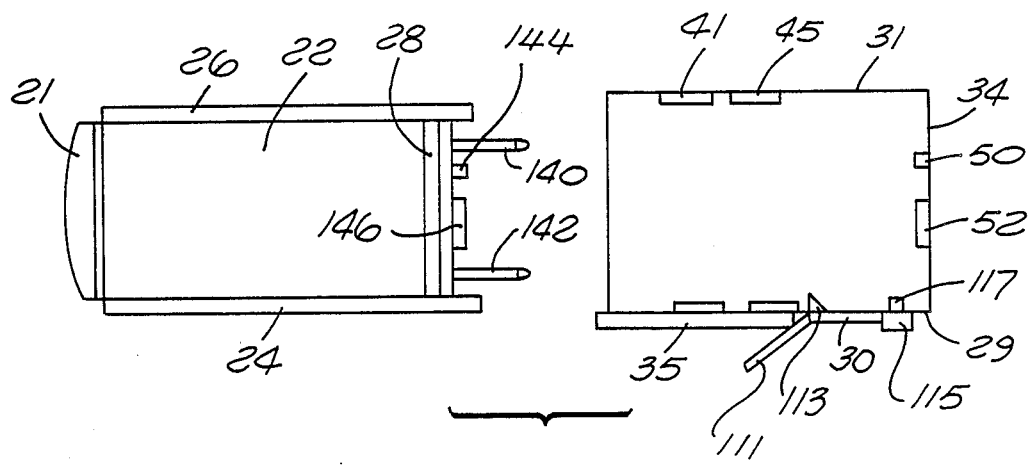
FIG. 17 is a bottom view of entire assembly of the present invention shown in FIG. 16.
Figure 16:
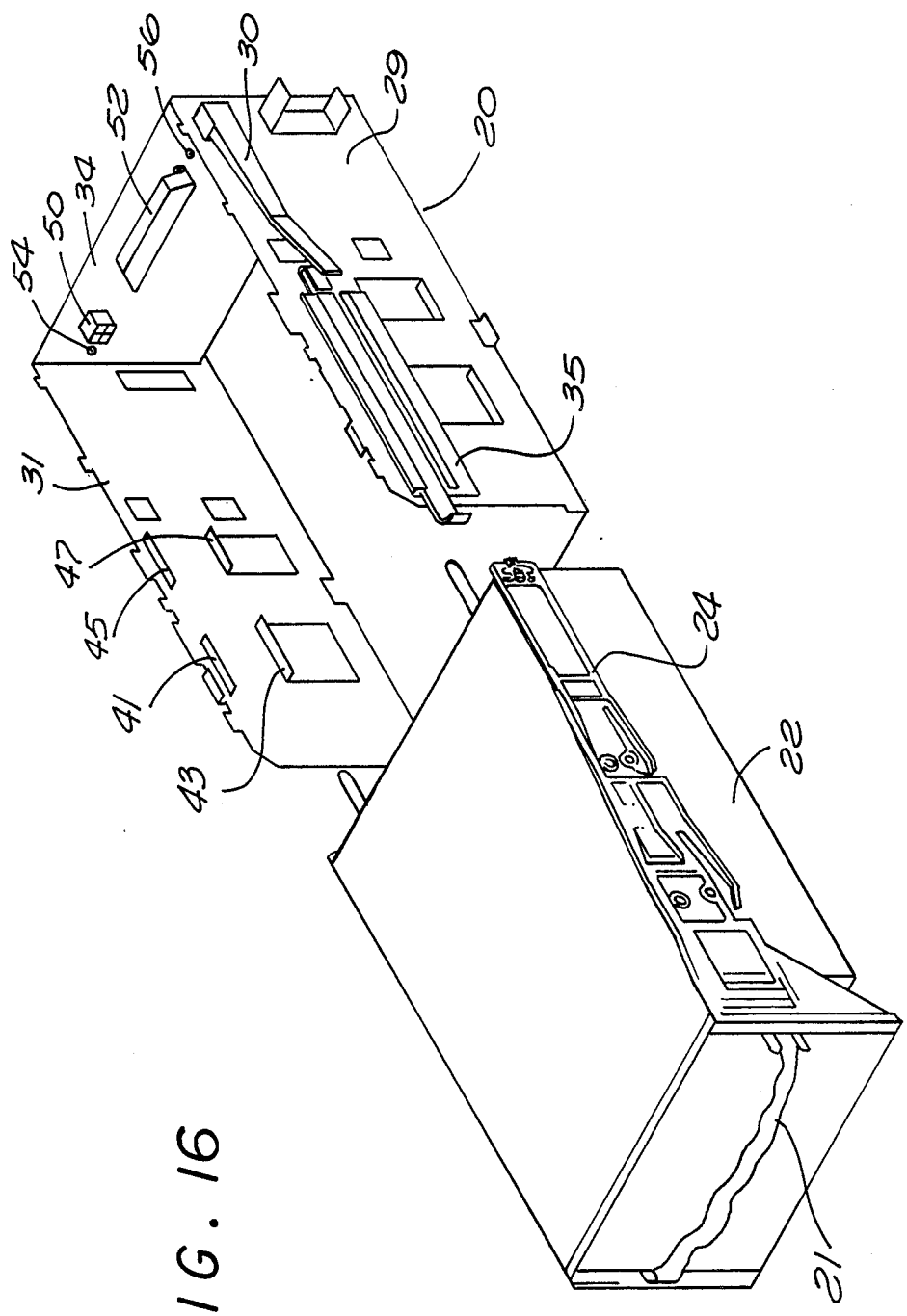
FIG. 16 is a top perspective view of entire assembly of the present invention.

As shown in FIGS. 16 and 17, a disk drive mounting plate 20 is adapted to receive a disk drive 22. The disk drive 22 has attached on each side a side bracket means 24 and 26 (only side bracket 24 being shown in FIG. 16). A handle 21 is provided to facilitate the removal and transportation of the disk drive upon removal. On the rear of the disk drive 22 is rear bracket 28 shown best in FIGS. 11-13 and discussed in more detail below.

The disk drive mounting plate is generally permanently secured in a designated portion of a computer housing and provides an adapted attachment site for the disk drive. Various disk drive mounting plates are known in the art, and it will be understood by a person of ordinary skill in the art that minor modifications may be made to the present invention to adapt to the various disk drive structures.

The disk drive mounting plate 20 has sides 29 and 31, top 33 and rear wall 34. Other embodiments of drive mounting plates may also have a top. Installed on the mounting plate 20 as part of the present invention is a locking member 30 and a release member 35. The locking member 30 is pivotably attached to the exterior of side 29 and the release member 35 is slidably attached to said mounting plate 20 and aligned with said locking member such that said release member abuts said locking member as will be described in more detail below.

On the inside of each side 29 and 31 of the mounting plate 20 is disposed a guide track 39 as shown in FIG. 17 and a similar guide track on the opposite wall, which are adapted to retain the side brackets 24 and 26 and permit the drive 22 to slide in and out of the mounting plate 20 in proper alignment. The guide track 37 may comprise one or more short lips 41, 43, 45, 47, 49 and 51 as shown in FIGS. 16 and 17, or it may be a continuous track, not shown, depending upon the desired configuration and the need for security and stability of the drive.

On the rear wall 34 of the mounting plate 20 are several electrical connectors 50 and 52, which will be described in more detail below, and pin holes 54 and 56. Corresponding to the pin holes 54 and 56 are pins 140 and 142 which are affixed to the rear bracket 28 as will also be described in more detail below.

Figure 2:
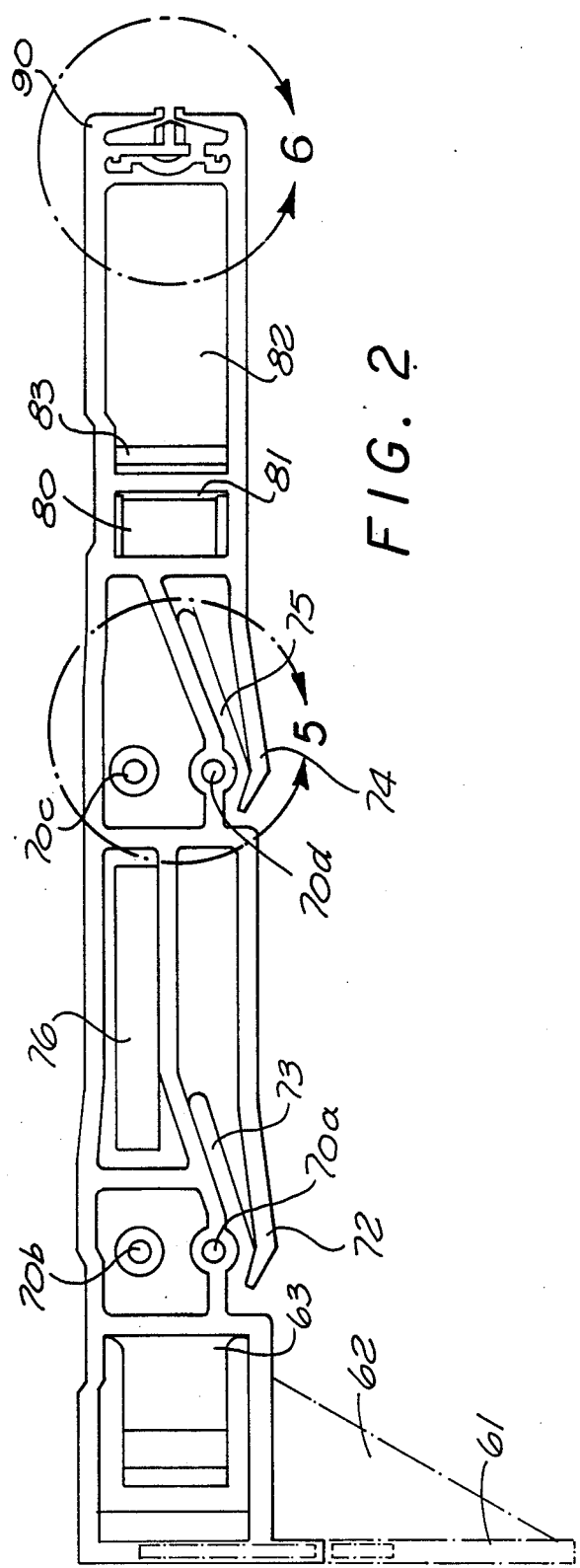
FIG. 2 is a front view one of the side brackets of the present invention.
Figure 3:
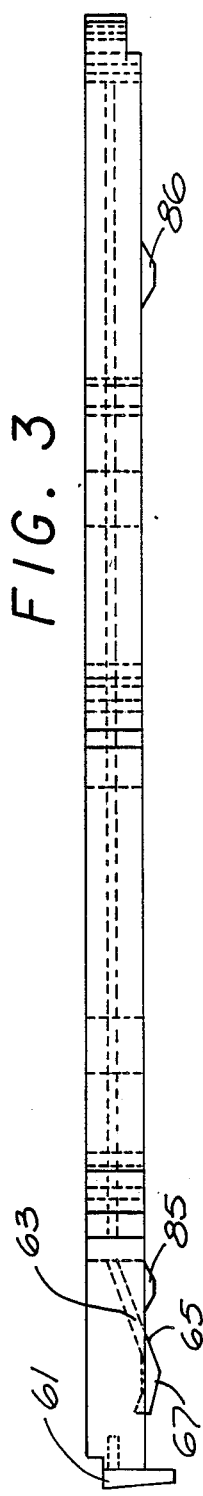
FIG. 3 is a top view of the side bracket of FIG. 2.
Figure 4:
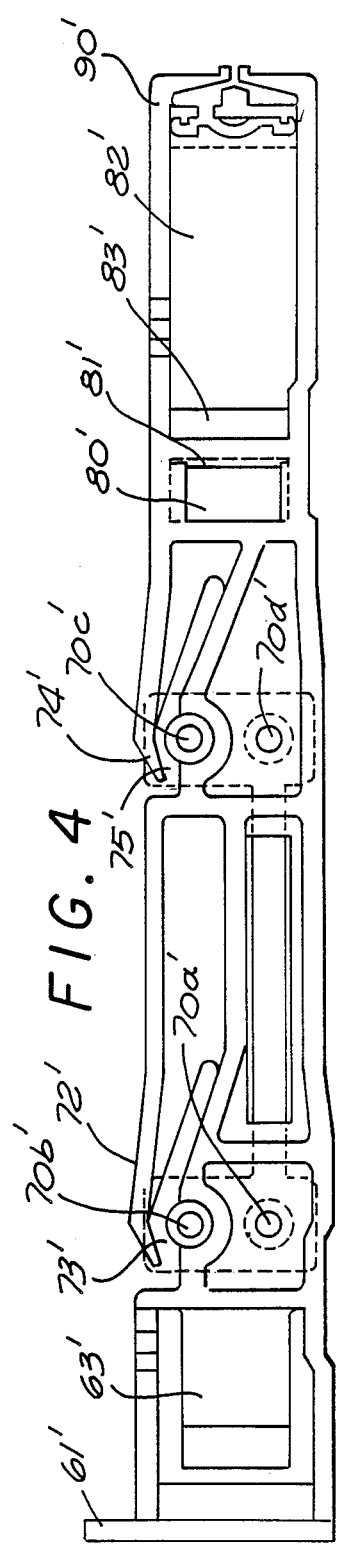
FIG. 4 is a front view one of an alternative side bracket of the present invention which would be used for a half-high disk drive.

Having generally described the components of the present invention, the particular elements of the components, beginning with the side bracket 24 will now be described with reference to FIGS. 2-5. FIG. 2 shows a side bracket 24 for a full high disk drive and FIG. 4 shows a side bracket 64 for a half-high disk drive. Referring first to FIG. 2, the front 61 is designed to frame the particular disk drive depicted herein and the webbing 62 provides some structural support for the attachment of the front 61 to the body of the bracket 24. First tension means 63 provides lateral tension against the track when installed and also provides lateral shock absorption as a result of its springy characteristics. The first tension means 63 is angled at 65 so that it can be easily slid in and is angled at 67 so that it does not catch as it is slid out of the mounting means. The side bracket 24 is screwed into the drive through holes 70a, 70b, 70c and 70d. Vertical tension means 72 and 74 are provided with sufficient clearance at 73 and 75 to permit adequate give of the tension means. The vertical tension means 72 and 74 provide tension against the track to permit tolerance, with a snug fit therein, and also shock absorption. A detent 80 is provided of sufficient size and shape to accommodate a locking flange, described later. The wall 81 of detent 80 may be angled backward to provide a positive locking surface that won't permit the flange to slip out without being forcibly removed by the release means. Adjacent the detent 80 is a smooth surface 82 on which the locking flange can slide until it is locked in the detent and a ramp means 83 which permits the locking flange to slide up to and into the detent from the smooth surface 82. As shown in FIG. 3, several solid nibs 85 and 86 are provided for a tight lateral fit of the side bracket within the track. The corresponding elements of the half-high side bracket in FIG. 4 are given the same element numerals with a ' to designate that they relate to the half high device.

Figure 5:
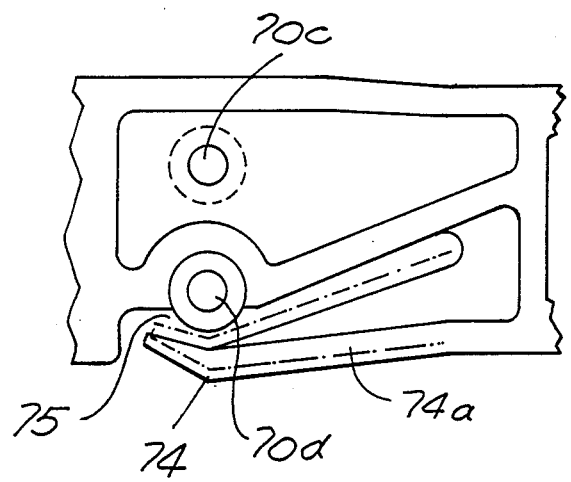
FIG. 5 is an enlarged front view of a portion of the side bracket taken through line 5 of FIG. 1 showing one of the tensioning means thereof.

As specifically shown in FIG. 5, the movement of the vertical tension means in 74 to 74a. As specifically shown in FIG. 6, the end 90 of the bracket is shown in detail. The end 90 holds the rear bracket 28 in position while it permits some freedom of movement to allow for proper alignment of the rear bracket and also provides some shock absorbant features in back and forth movement. Nib 92 shown in FIG. 2 helps to hold the rear bracket 28 in place. Arms 94 and 96 are shown in solid lines and in ghost lines to illustrate the movement of the arms for purposes of shock, are provided to allow for tolerance in construction absorption. Nib 95 limits the movement of arms 94 and 96.

Figure 7:
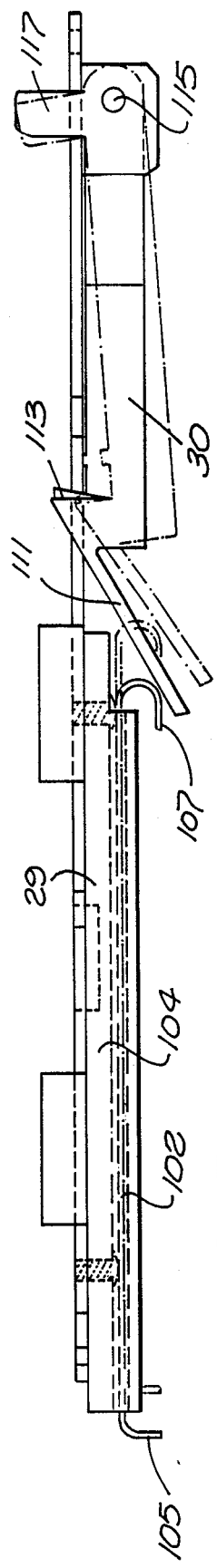
FIG. 7 is a top view of one side of a disk drive mounting showing a release means and flange means of the present invention and showing the operation of the release means.
Figure 8:
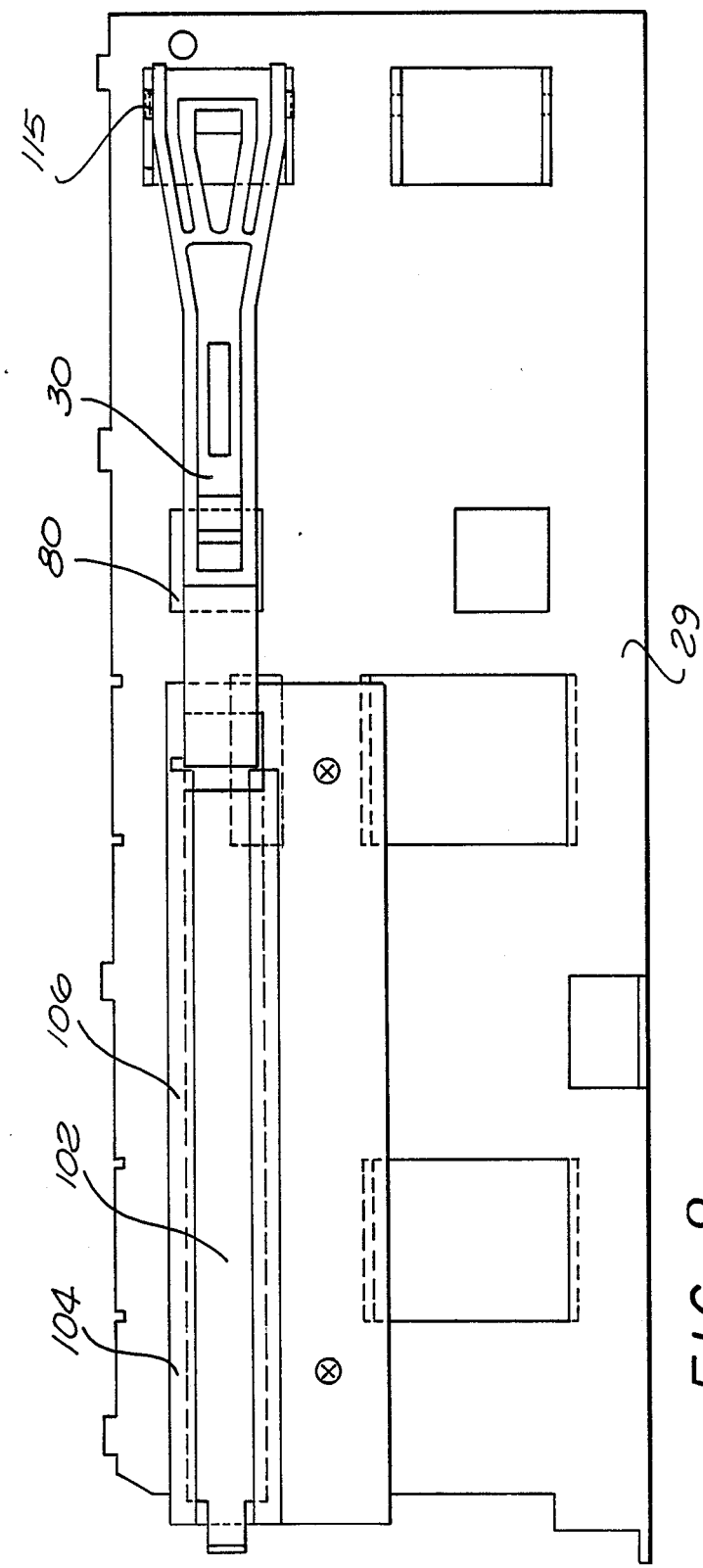
FIG. 8 is a side view of the outside of the disk drive mounting of FIG. 7 showing the release means and flange means of the present invention.
Figure 9:
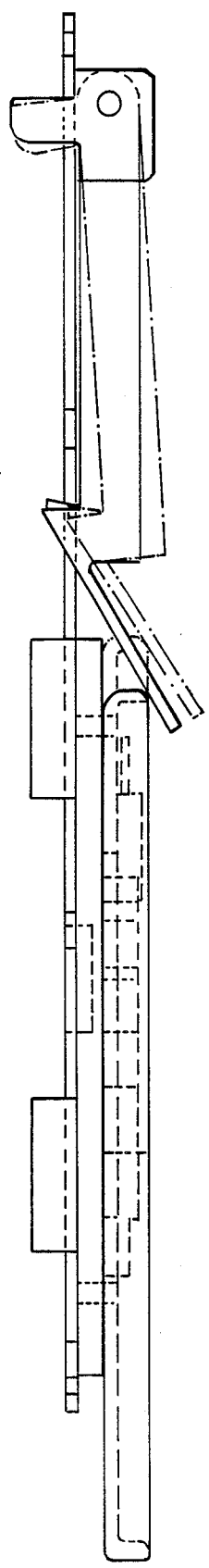
FIG. 9 is a top view of the preferred embodiment of the release means shown in FIG. 1 attached to the wall of the disk mounting and showing the release means in the latch position and release position.
Figure 10:
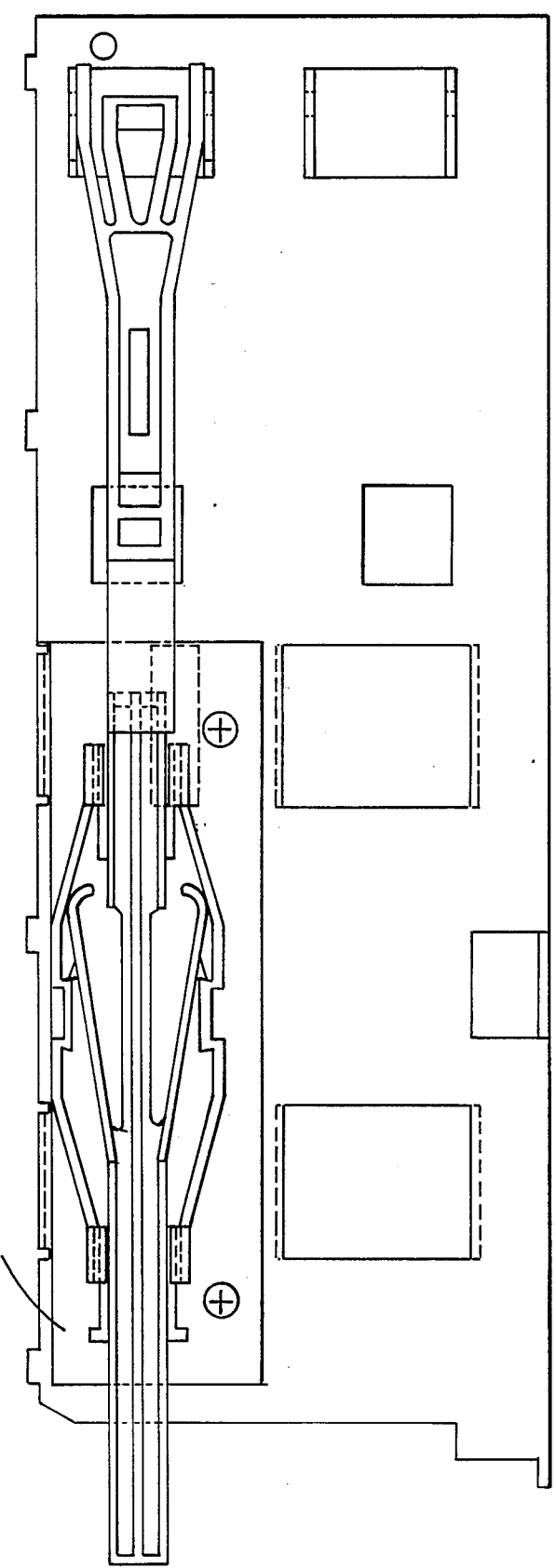
FIG. 10 is a front view of the release means of FIG. 9.

FIGS. 7, 8, 9 and 10 illustrate the release means, FIGS. 7 and 8 illustrating one embodiment and FIGS. 9 and 10 illustrating the preferred embodiment. As shown in FIGS. 7 and 8, release means 35 comprises slide 102 disposed in bracket 104 and retained therein by lip means 106 which partially overlays slide 102. Button 105 is pushed ejecting the drive which in turn causes pusher 107 to engage angled surface 111. As surface 111 is engaged by pusher 107 it causes locking means 30 to pivot. Locking means 30 is pivotably attached to mounting means side 29 through hinge 115. When locking means 30 pivots it causes locking flange 113 to be removed from detent 80 and also causes flange 117 to rotate. Flange 113 is angled slightly to lock securely in place until forcefully unlocked by the release means. In installing a drive in the housing, the back of the drive engages the flange 117, causing locking means 30 to pivot, which in turn moves locking flange 113 toward and into detent 80.

Figure 1:
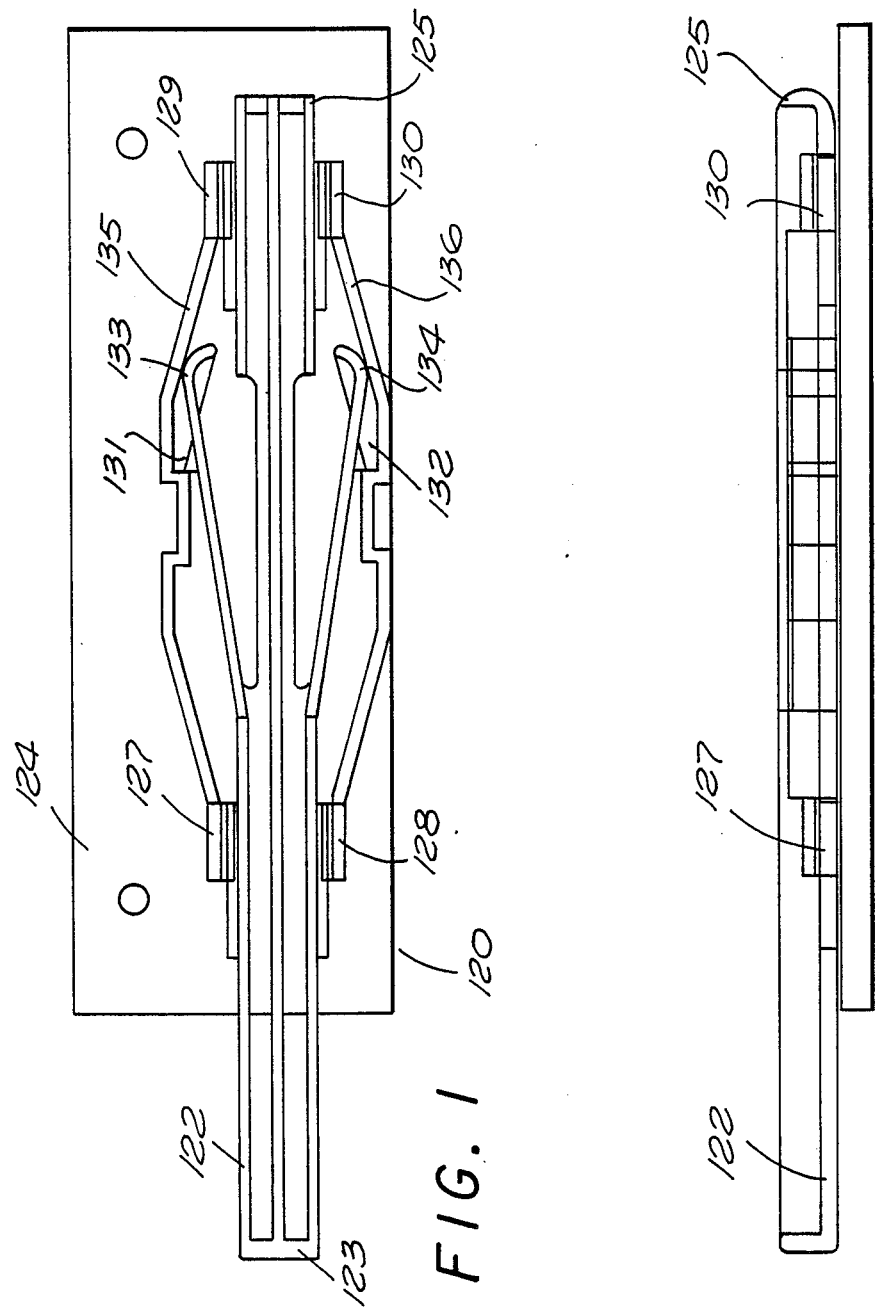
FIG. 1 is a front view of the preferred embodiment of the release means comprising the release means bracket and button.

The preferred embodiment release means is shown in FIGS. 9 and 10 and the button means is specifically shown in FIGS. 1 and 1a. Button means 120 is comprised of slide 122 and bracket 124. Slide 122 is comprised of button end 123 and pusher end 125. Slide 122 is retained in bracket 124 by being disposed under tabs 127, 128, 129 and 130. Tabs 131 and 132 abut stops 155 and 156 to prevent the slide 122 from backsliding. Wings 133 and 134 are flexible plastic with a tendency to spread outward and are forced against sides 135 and 136 so that when the button end 123 is depressed, the arms collapse inward and push with increasing force against the sides so that the tendency of the button end 123 is to move outward back to its original position.

Figure 13:
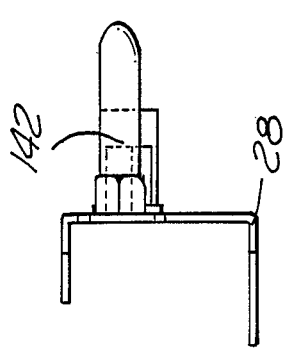
FIG. 13 is a side view of the pin member on the rear bracket as taken through lines 13—13 of FIG. 11.
Figure 11:
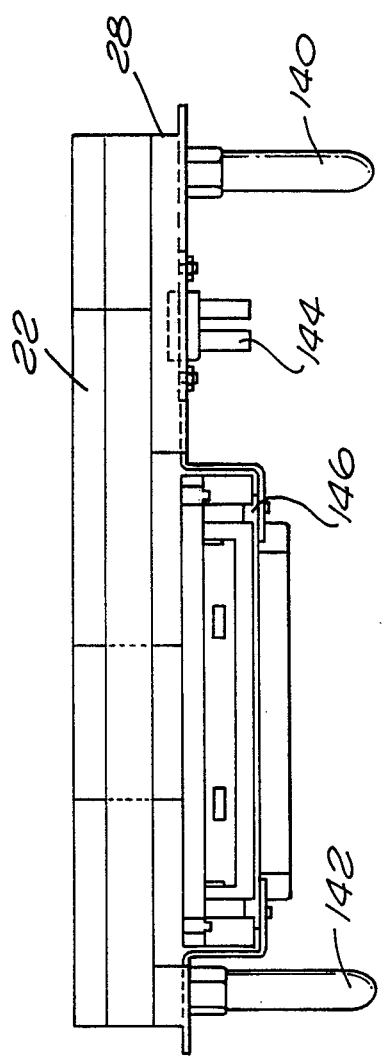
FIG. 11 is a top view of the rear bracket of the present invention.
Figure 12:
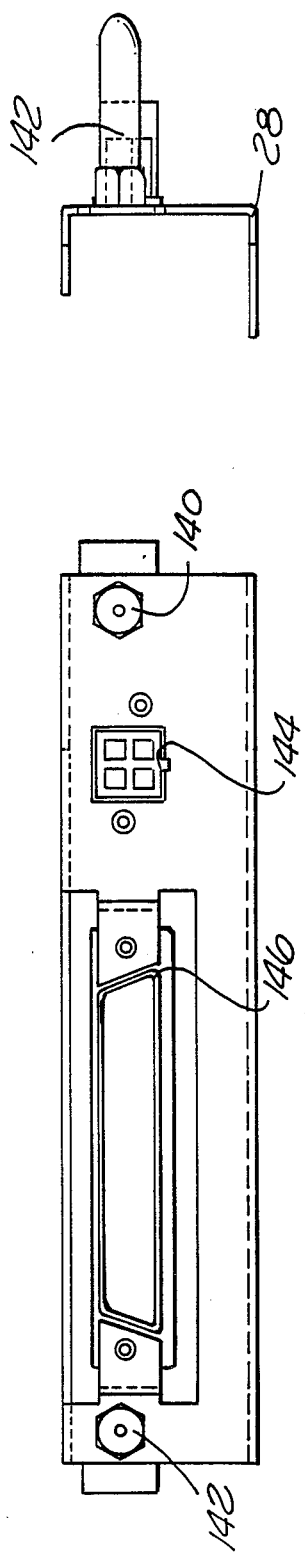
FIG. 12 is a front view of the rear bracket of FIG. 11 of the present invention.

FIGS. 11, 12 and 13 depict the rear bracket 28. Pins 140 and 142 are fixed in place in careful relationship to electrical connectors 144 and 146, particularly with respect to connector 146. Because of the slot type mounting of the rear bracket 28 in end 90, the rear bracket moves slightly and its position can be adjusted so that the electrical connections can align exactly for a proper fit. FIGS. 14 and 15 depict the rear wall 34 of the mounting means. As shown in FIG. 14, the power plug mounting is shown in partial cutaway form to illustrate a bushing 148 to provide freedom of movement so that the positioning of the separate electrical connectors 50 and 52 is not of utmost criticality. Holes 54 and 56 are aligned so that when the pins 140 and 142 are placed therein the electrical connectors line up.

It will be obvious to a person of ordinary skill in the art that the present invention is not limited to the specific devices described as the preferred embodiments herein. The only limitations of the present invention are set forth in the claims appended hereto and any equivalents thereof.

We claim:

1. Means for retaining a drive system in a computer housing and releasing said drive system therefrom comprising:

drive mounting means disposed in said computer housing, said drive mounting means comprising track means and a rear mounting plate, said rear mounting plate having disposed therein electrical connector means and alignment pin receiving members;

bracket means attached to said drive system, said bracket means comprising side bracket means and rear bracket means, said side bracket means being attached to the sides of said drive system and being adapted to fit within said track means, and said rear bracket means having disposed therein electrical connector means adapted to mate with said electrical connector means of said rear mounting plate, and said rear bracket means further comprising alignment pins adapted to mate with said alignment pin receiving members, and whereby said rear bracket is movably attached to said drive system such that said rear bracket has limited freedom of movement to permit alignment of said electrical connector means thereof with said electrical connector means of said rear mounting plate, and said side bracket means further comprising a locking flange receiving means;

locking means for locking said drive system within said mounting means, said locking means comprising an elongated bar pivotably mounted on the exterior of said mounting means and having a front end and a back end, a flange means disposed on said back end, said flange means being disposed in the path of the drive system when said drive system is installed in said mounting means, said elongated bar having a locking flange extending inward toward said drive system and disposed between said front end and said back end, said locking flange being adapted to fit in said locking flange receiving means, and said elongated bar further having an angled surface disposed on said front end such that pressure applied to said angled surface causes the front end of said locking means to pivot away from said mounting means so that said locking flange is removed from said detent thereby unlocking said drive system from said mounting means;

release means comprising a sliding button adapted to engage said angled surface such that when said button is depressed, said locking means pivots, said locking flange is removed from said detent in said side bracket and said ejecting flange pivots forward to eject said drive system from said mounting means.

2. The retaining button means of claim 1 wherein said button means comprises:

a housing having retaining slot means, stop means and angled sides forming a narrowing channel;

slide means comprising an elongated bar, tab means adapted to fit in said slot means for holding said slide means in said housing, a pair of flexible arms having a tendency to spring outward, said arms being disposed in said housing adjacent said angled sides, with said angled sides forming an increasingly narrow channel in the direction the button means is intended to slide such that when said button means is depressed, said flexible arms are compressed towards each other thereby causing increasing resistance and tendency to regain the initial position, and elongated bar having disposed thereon a flange means adjacent said stop means to prevent the arm means from sliding the button means out of said housing.

3. A button means comprising:

a housing having retaining slot means, stop means and angled sides forming a narrowing channel;

slide means comprising an elongated bar, tab means adapted to fit in said slot means for holding said slide means in said housing, a pair of flexible arms having a tendency to spring outward, said arms being disposed in said housing adjacent said angled sides, with said angled sides forming an increasingly narrow channel in the direction the button means is intended to slide such that when said button means is depressed, said flexible arms are compressed towards each other thereby causing increasing resistance and tendency to regain the initial position, and said elongated bar having disposed thereon a flange means adjacent said stop means to prevent the arm means from sliding the button means out of said housing.

* * * * *

UNITED STATES PATENT AND TRADEMARK OFFICE
CERTIFICATE OF CORRECTION

PATENT NO. : 4,960,384
DATED : 10/2/90
INVENTOR(S) : Singer et al.

It is certified that error appears in the above-identified patent and that said Letters Patent is hereby corrected as shown below:

| | | |
|---|---|---|
| col. 02, line 40 | before "pins" | insert --alignment-- |
| col. 02, line 53 | after "mounting" | insert --means-- |
| col. 02, line 58 | after "with", delete "the" | insert --a-- |
| col. 03, line 13 | after "has" | insert --a-- |
| col. 03, line 18 | delete "to" | |
| col. 03, line 38 | after "view" | insert --of-- |
| col. 03, line 41 | after "view" | delete "one" |
| col. 04, line 05 | after "of" | insert --the-- |
| col. 04, line 07 | before "entire" | insert --the-- |
| col. 04, line 31 | after "plate" | insert --20-- |
| col. 04, line 34 | after "drive" (1st occurrence) | insert --22-- |
| col. 04, line 40 | delete "top 33" | |
| col. 05, line 25 | after "Adjacent" | insert --to-- |
| col. 05, line 36 | delete "in" | insert --is from-- |
| col. 05, line 45 | after "shock" | insert --absorption-- |
| col. 05, line 46 | after "construction" | delete "absorption" |
| col. 06, line 19 | delete "connections" | insert --connectors-- |
| col. 07, line 11 | delete "detent" | insert --locking flange receiving means-- |
| col. 07, line 17 | delete "detent" | insert --locking flange receiving means-- |
| col. 07, line 21 | delete "button" | |

UNITED STATES PATENT AND TRADEMARK OFFICE
CERTIFICATE OF CORRECTION

PATENT NO. : 4,960,384

DATED : 10/2/90

INVENTOR(S) : Singer et al.

Page 2 of 9

It is certified that error appears in the above-identified patent and that said Letters Patent is hereby corrected as shown below:

Delete Fig. 1

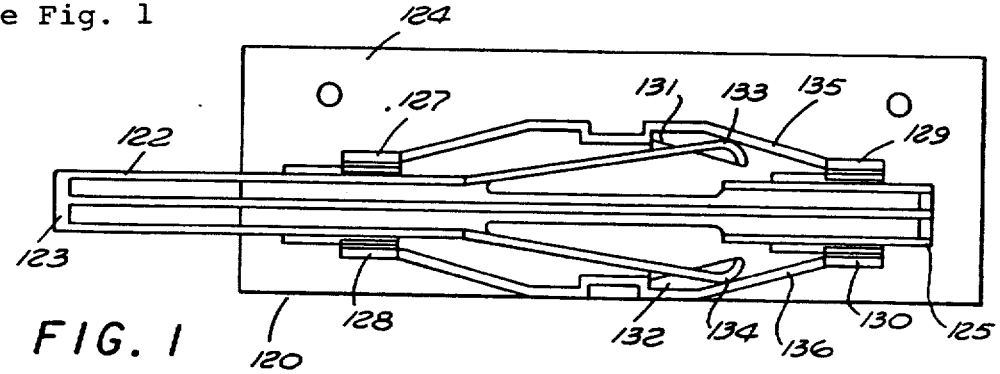

Insert Fig. 1

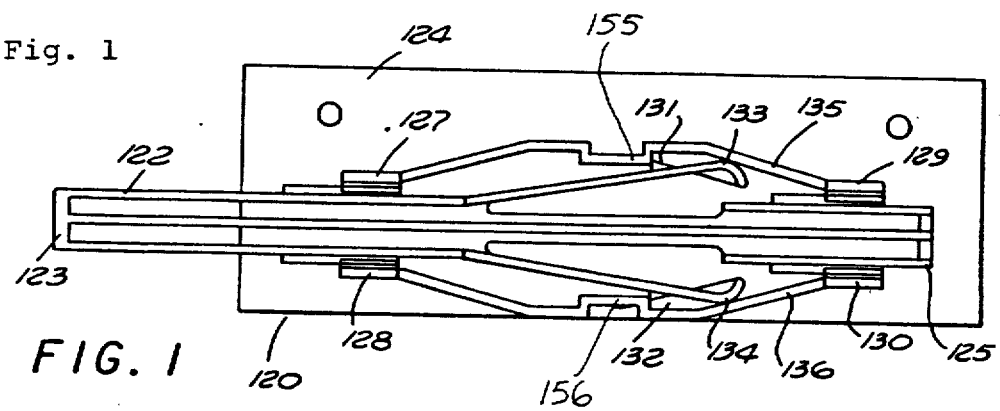

UNITED STATES PATENT AND TRADEMARK OFFICE
CERTIFICATE OF CORRECTION

PATENT NO. : 4,960,384

DATED : 10/2/90

INVENTOR(S) : Singer et al.

Page 3 of 9

It is certified that error appears in the above-identified patent and that said Letters Patent is hereby corrected as shown below:

Delete Fig. 2

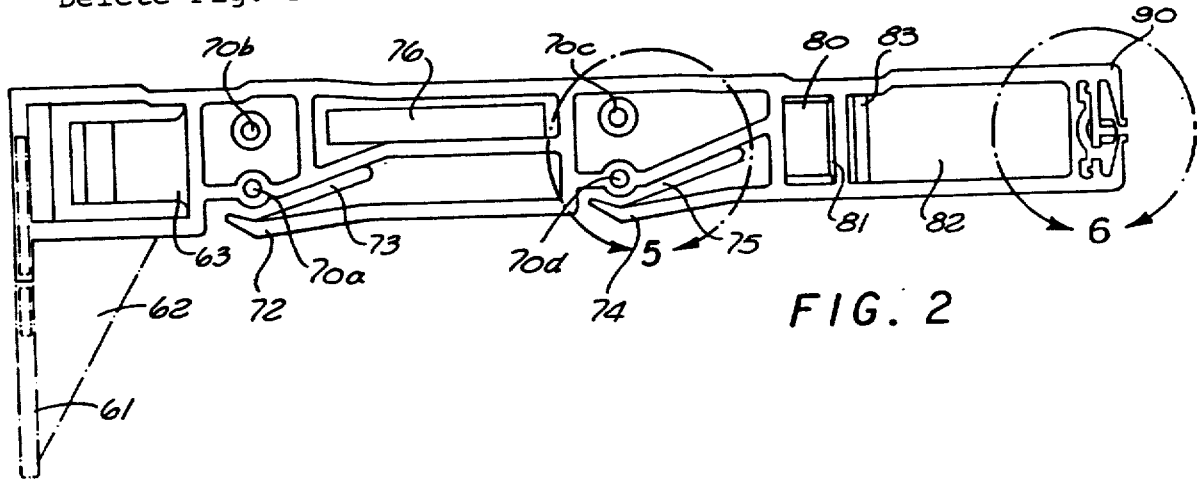

Insert Fig. 2

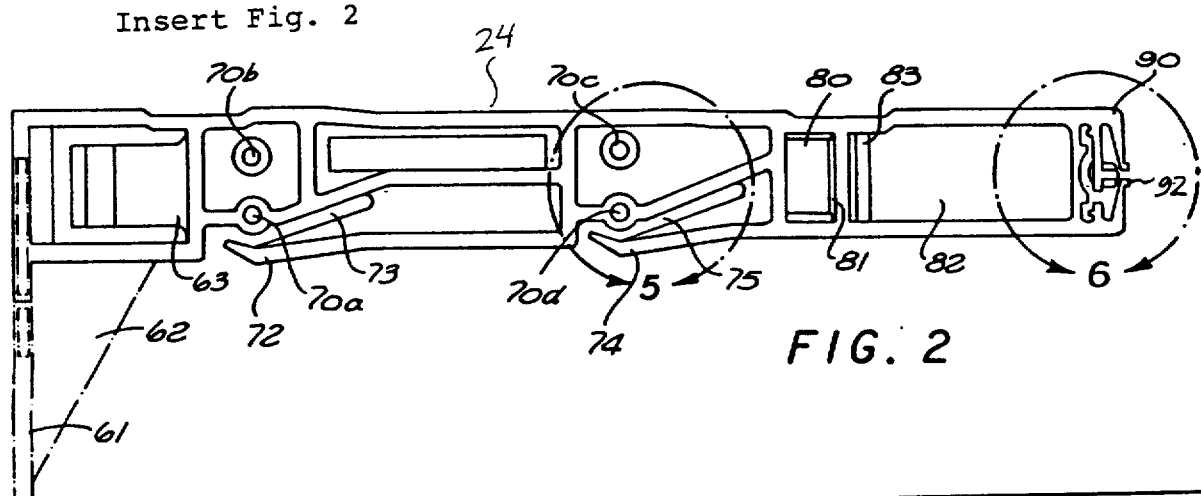

UNITED STATES PATENT AND TRADEMARK OFFICE
CERTIFICATE OF CORRECTION

PATENT NO. : 4,960,384
DATED : 10/2/90
INVENTOR(S) : Singer et al.

It is certified that error appears in the above-identified patent and that said Letters Patent is hereby corrected as shown below:

Delete Fig. 4

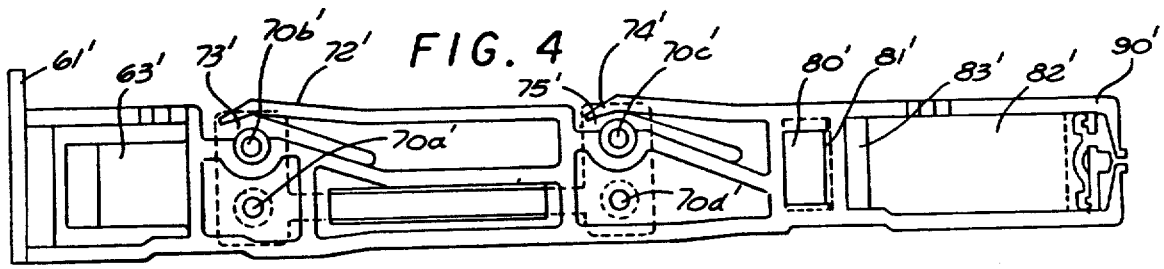

Insert Fig. 4

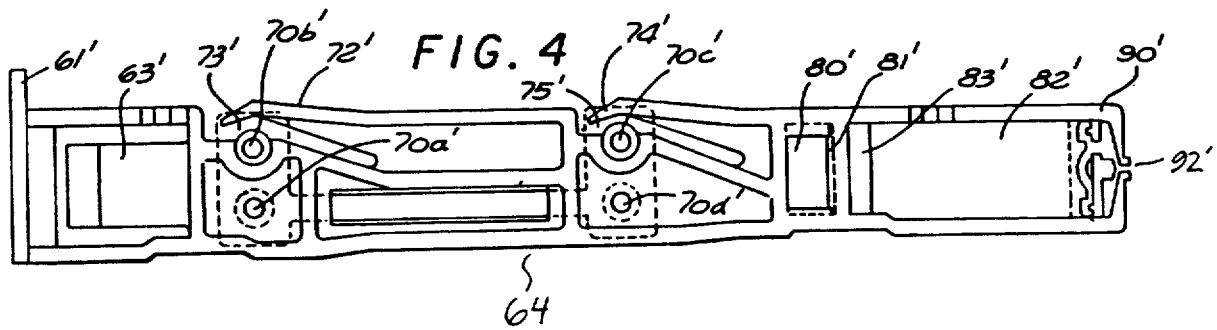

UNITED STATES PATENT AND TRADEMARK OFFICE
CERTIFICATE OF CORRECTION

PATENT NO. : 4,960,384

DATED : 10/2/90

INVENTOR(S) : Singer et al.

Figure 6:
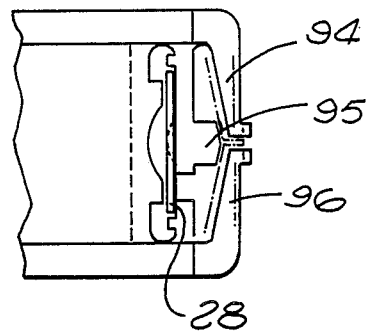
FIG. 6 is an enlarged front view of a portion of the side bracket taken through line 6 of FIG. 1 showing the end portion of the side bracket

It is certified that error appears in the above-identified patent and that said Letters Patent is hereby corrected as shown below:

Delete Fig. 6

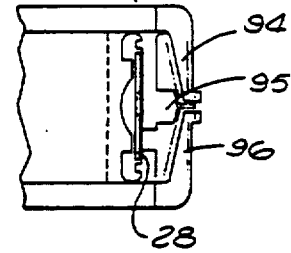

FIG. 6

Insert Fig. 6

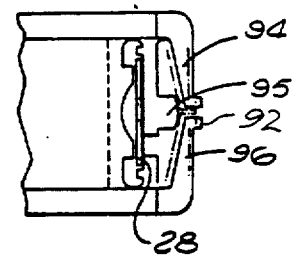

FIG. 6

UNITED STATES PATENT AND TRADEMARK OFFICE
CERTIFICATE OF CORRECTION

PATENT NO. : 4,960,384

DATED : 10/2/90

INVENTOR(S) : Singer et al.

It is certified that error appears in the above-indentified patent and that said Letters Patent is hereby corrected as shown below:

Delete Fig. 7

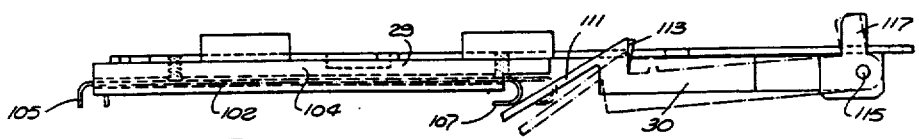

FIG. 7

Insert Fig. 7

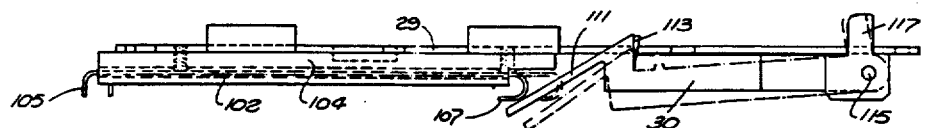

FIG. 7

UNITED STATES PATENT AND TRADEMARK OFFICE
CERTIFICATE OF CORRECTION

PATENT NO. : 4,960,384

DATED : 10/2/90

INVENTOR(S) : Singer et al.

It is certified that error appears in the above-identified patent and that said Letters Patent is hereby corrected as shown below:

Delete Fig. 16

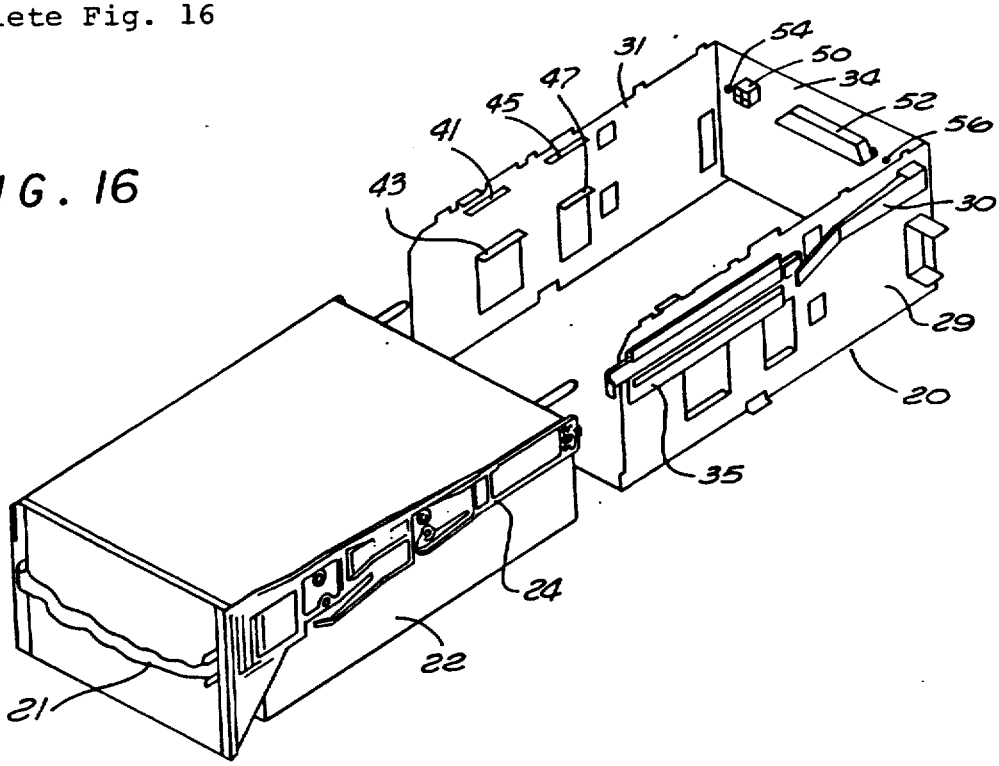

FIG. 16

UNITED STATES PATENT AND TRADEMARK OFFICE
CERTIFICATE OF CORRECTION

PATENT NO. : 4,960,384

DATED : 10/2/90

INVENTOR(S) : Singer et al.

Page 8 of 9

It is certified that error appears in the above-identified patent and that said Letters Patent is hereby corrected as shown below:

Insert Fig. 16

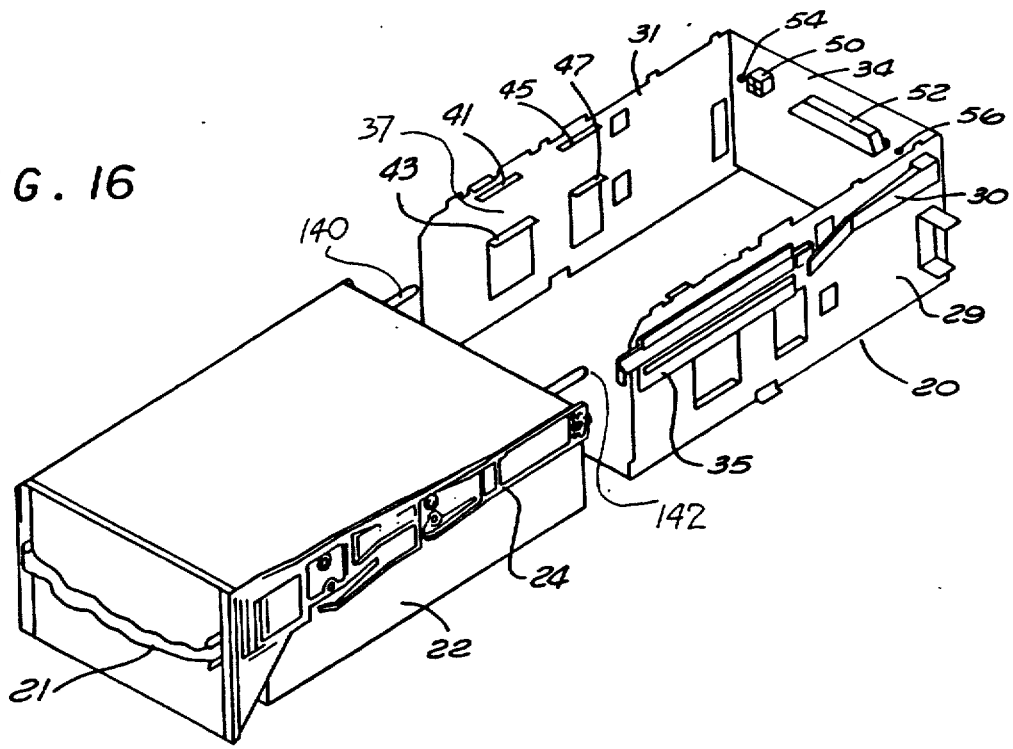

UNITED STATES PATENT AND TRADEMARK OFFICE
CERTIFICATE OF CORRECTION

PATENT NO. : 4,960,384                                      Page 9 of 9
DATED      : 10/2/90
INVENTOR(S): Singer et al.

It is certified that error appears in the above-indentified patent and that said Letters Patent is hereby corrected as shown below:

Delete Fig. 17

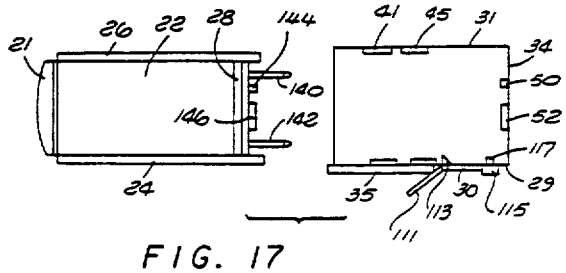

FIG. 17

Insert Fig. 17

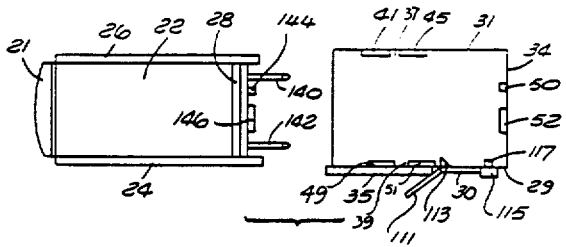

FIG. 17

Signed and Sealed this

Twenty-eight Day of February, 1995

Attest:

BRUCE LEHMAN

Attesting Officer        Commissioner of Patents and Trademarks